(12) United States Patent
Adagouda Patil et al.

(10) Patent No.: US 10,338,153 B2
(45) Date of Patent: Jul. 2, 2019

(54) METHOD AND APPARATUS FOR AUTOMATICALLY ESTIMATING REMAINING USEFUL LIFE (RUL) OF BATTERY IN REAL TIME

(71) Applicant: Samsung Electronics Co., Ltd., Suwon-si (KR)

(72) Inventors: Meru Adagouda Patil, Bangalore (IN); Krishnan Seethalakshmy Hariharan, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 362 days.

(21) Appl. No.: 15/059,521

(22) Filed: Mar. 3, 2016

(65) Prior Publication Data

US 2016/0259014 A1    Sep. 8, 2016

(30) Foreign Application Priority Data

Mar. 3, 2015    (IN) .......................... 1024/CHE/2015
Feb. 11, 2016   (KR) ........................ 10-2016-0015486

(51) Int. Cl.
  *G01R 31/36*    (2019.01)
  *G01R 31/392*   (2019.01)
  *G01R 31/367*   (2019.01)

(52) U.S. Cl.
  CPC ......... *G01R 31/392* (2019.01); *G01R 31/367* (2019.01)

(58) Field of Classification Search
  CPC ............ G01R 31/3679; G01R 31/3651; G01R 31/3606; G01R 31/3648; G01R 31/3662; G01R 31/3693
  See application file for complete search history.

(56) References Cited

U.S. PATENT DOCUMENTS

| | | | | |
|---|---|---|---|---|
| 8,332,342 B1* | 12/2012 | Saha | .................... | G01R 31/392 706/45 |
| 8,577,459 B2* | 11/2013 | Cowley | .................. | A61N 1/378 607/29 |
| 8,855,954 B1* | 10/2014 | Bickford | .................. | G07C 3/08 702/63 |
| 9,660,299 B2* | 5/2017 | Xu | ........................ | H01M 10/42 |
| 9,843,069 B2* | 12/2017 | Marcicki | ........... | H01M 10/0525 |
| 9,846,199 B2* | 12/2017 | Vian | ................... | H01M 10/425 |
| 2009/0027056 A1* | 1/2009 | Huang | .................... | B60L 58/12 324/439 |
| 2012/0053837 A1* | 3/2012 | Viassolo | ............... | H01M 10/46 702/1 |
| 2012/0120127 A1* | 5/2012 | Yamaguchi | .............. | G09G 3/20 345/690 |
| 2013/0260188 A1* | 10/2013 | Coates | .................. | H01M 10/42 429/50 |
| 2014/0015532 A1* | 1/2014 | Uchida | ................ | G01R 31/392 324/426 |

(Continued)

*Primary Examiner* — Jaehwan Oh
(74) *Attorney, Agent, or Firm* — NSIP Law

(57) ABSTRACT

A method of estimating a remaining useful life (RUL) of a battery includes: identifying a class of data of the battery in real time; determining whether a second level RUL estimation is set for the class; estimating a gross RUL by performing a first level RUL estimation in response to the second level RUL estimation not being set for the class; and estimating a fine RUL of the battery in response to the second level RUL estimation being set for the class.

17 Claims, 12 Drawing Sheets

(56) References Cited

U.S. PATENT DOCUMENTS

| | | | |
|---|---|---|---|
| 2014/0333313 A1* | 11/2014 | Surampudi | H01M 10/48 |
| | | | 324/426 |
| 2015/0042267 A1* | 2/2015 | Wang | H02J 7/0052 |
| | | | 320/108 |
| 2015/0077126 A1* | 3/2015 | Wang | H01M 10/44 |
| | | | 324/428 |
| 2015/0112619 A1* | 4/2015 | Takahashi | H01M 10/48 |
| | | | 702/63 |
| 2015/0160302 A1* | 6/2015 | Xu | H01M 10/42 |
| | | | 324/427 |
| 2015/0349385 A1* | 12/2015 | Hu | H01M 10/48 |
| | | | 429/91 |
| 2016/0139210 A1* | 5/2016 | Coenen | B60L 58/16 |
| | | | 702/63 |
| 2016/0209472 A1* | 7/2016 | Chow | B60L 58/12 |
| 2017/0153292 A1* | 6/2017 | Steiber | G01R 31/392 |
| 2017/0205466 A1* | 7/2017 | He | G06F 17/16 |

\* cited by examiner

METHOD AND APPARATUS FOR AUTOMATICALLY ESTIMATING REMAINING USEFUL LIFE (RUL) OF BATTERY IN REAL TIME

CROSS-REFERENCE TO RELATED APPLICATION(S)

This application claims the benefit under 35 USC 119(a) of Indian Patent Application No. 1024/CHE/2015, filed on Mar. 3, 2015 in the Indian Patent Office, and Korean Patent Application No. 10-2016-0015486, filed on Feb. 11, 2016 in the Korean Intellectual Property Office, the entire disclosures of which are incorporated herein by reference for all purposes.

BACKGROUND

1. Field

The following description relates to battery state of health (SOH) monitoring, and more particularly, to real-time measurement of a remaining useful life (RUL) of a battery.

2. Description of Related Art

An electric battery is an efficient and widely used device for storage of energy, which supplies electrical energy to power devices. Batteries of different sizes and capacities are available for different applications. For example, AA batteries are commonly used to power portable electronic devices. A lithium-ion battery is another type of battery which offers improved battery back-up. Similarly, bigger batteries having higher capacities and more outputs are used in applications that demand durability and higher power supply.

Batteries are generally classified as disposable batteries and rechargeable batteries. The disposable batteries are thrown away after use, and the rechargeable batteries are recharged by plugging the batteries in to an external power supply.

All rechargeable batteries are designed with a fixed life cycle in terms of number of charge and discharge cycles (recharge cycles). For example, one rechargeable battery may support 300 recharge cycles, whereas another rechargeable battery may support 500 recharge cycles. In critical applications that demand continuous power supply, a time used to replace a dead battery can prove to be disastrous. A battery management system provides an option for estimating a remaining useful life (RUL) of a battery, which provides a user with a fair estimate of remaining charge cycles of the battery. However, existing systems and methods that estimate RULs demand a large amount of data for RUL estimation, and thus implementation of real-time on-board applications is difficult.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a method of estimating a remaining useful life (RUL) of a battery includes: identifying a class of data of the battery in real time; determining whether a second level RUL estimation is set for the class; estimating a gross RUL by performing a first level RUL estimation in response to the second level RUL estimation not being set for the class; and estimating a fine RUL of the battery in response to the second level RUL estimation being set for the class.

The class may be pre-defined based on a number of at least one of charge, discharge, and impedance cycles of the battery.

The identifying of the class may include: collecting at least one primary parameter; generating at least one secondary parameter from the at least one primary parameter; generating an optimized set of parameters based on the primary and secondary parameters; generating a real-time artificial intelligence (AI) model specific to the data of the battery based on the optimized set of parameters; comparing the real-time AI model with a reference AI model; and identifying the class in the reference AI model having data matching data in the real-time AI model.

The estimating of the gross RUL may include measuring a rough estimate of the RUL of the battery.

The estimating of the fine RUL may include: collecting battery-specific data identified as belonging to the class; generating a regression model based on the collected battery-specific data; comparing the regression model with a reference regression model representing an optimized data set that represents the class; identifying data in the reference regression model matching data in the regression model; and estimating an RUL representing the identified data in the reference regression model as the fine RUL.

The method may further include: displaying the estimated fine RUL in response to a difference between the fine RUL and an end of life (EOL) of the battery being less than or equal to a threshold value.

A system for estimating a remaining useful life (RUL) of a battery may include: an RUL estimator; and a non-volatile memory including instructions. The instructions are configured to cause the RUL estimator to: identify a class of data of the battery in real time; determine whether a second level RUL estimation is set for the class; estimate a gross RUL by performing a first level RUL estimation in response to the second level RUL estimation not being set for the class; and estimate a fine RUL of the battery in response to the second level RUL estimation being set for the class.

The RUL estimator may be configured to provide at least one option to pre-define the class based on a number of at least one of charge, discharge, and impedance cycles of the battery.

The system may further include a classifier configured to: collect at least one primary parameter using an input/output (I/O) interface; generate at least one secondary parameter from the at least one primary parameter; generate an optimized set of parameters based on the primary and secondary parameters; generate a real-time artificial intelligence (AI) model specific to the data of the battery based on the optimized set of parameters; compare the real-time AI model with a reference AI model; and identify the class in the reference AI model having data matching data in the real-time AI model, wherein the RUL estimator is configured to identify the class of the data of the battery using the classifier.

The system may further include: a regression analyzer configured to measure a rough estimate of the RUL, wherein the RUL estimator is configured to estimate the gross RUL using the regression analyzer.

To estimate the fine RUL of the battery, the RUL estimator may be configured to: collect battery-specific data identified as belonging to the class; generate a regression model based on the collected battery-specific data; compare the regression model with a reference regression model representing an optimized data set that represents the class; identify data in the reference regression model matching data in the regression model; and estimate the fine RUL based on the second level RUL estimation by estimating an RUL representing the identified data in the reference regression model as the fine RUL.

The system may further include: a display configured to display the fine RUL in response to a difference between the fine RUL and an end of life (EOL) of the battery being less than or equal to a threshold value.

According to another general aspect, a remaining useful life (RUL) estimator includes: a processor; a classifier implemented by the processor and configured to identify a class of data of a battery in real time; a state of health (SOH) monitor implemented by the processor and configured to determine whether a second level RUL estimation is set for the class; a regression analyzer implemented by the process and configured to estimate a gross RUL by performing a first level RUL estimation in response to the second level RUL estimation not being set for the class, and estimate a fine RUL of the battery in response to the second level RUL estimation being set for the class.

The estimating of the gross RUL may include measuring a rough estimate of the RUL of the battery.

The class may be pre-defined based on a number of at least one of charge, discharge, and impedance cycles of the battery.

The RUL estimator may be configured to trigger an alert in response to the estimated fine RUL being greater than an upper threshold value or less than a lower threshold value.

Other features and aspects will be apparent from the following detailed description, the drawings, and the claims.

Figure 1:
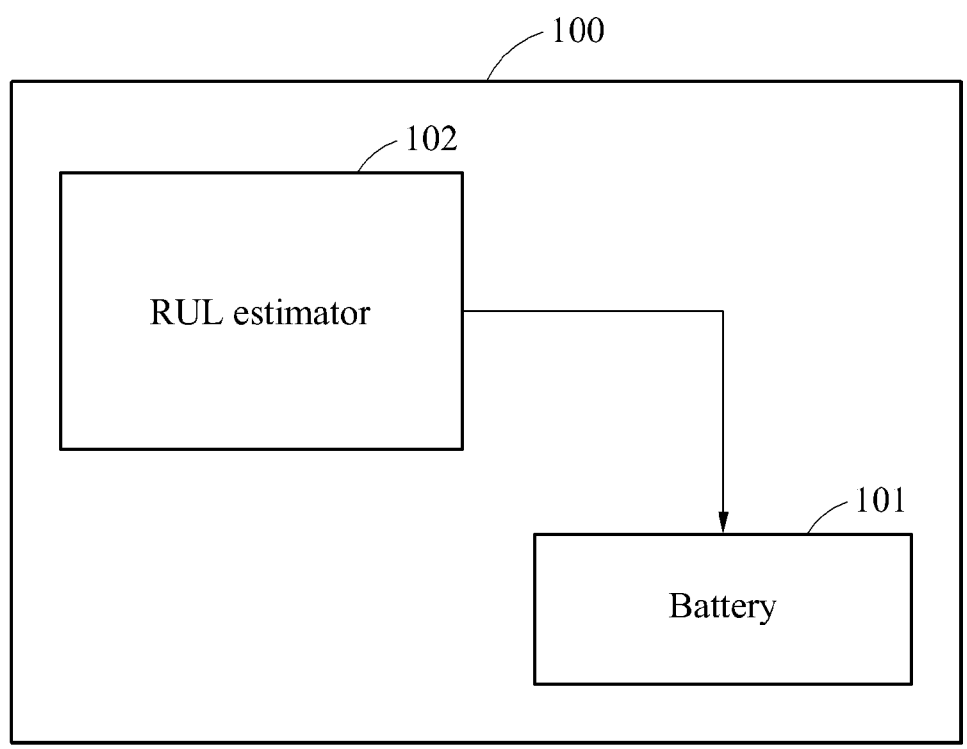
FIG. 1 is a block diagram illustrating an example of a real-time battery management system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element.

It will be understood that when an element is referred to as being "connected," or "coupled," to another element, it may be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "include/comprise" and/or "have" when used in this specification, specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating an example of a real-time battery management system 100 including at least one battery 101 and a remaining useful life (RUL) estimator 102.

The RUL estimator 102 establishes communication with the battery 101 using a suitable channel, and monitors a state of health (SOH) of the battery 101 in real time. In an example, an operation of monitoring the SOH of the battery 101 includes an operation of estimating an RUL of the battery 101 in real time. In another example, the RUL estimator 102 generates an artificial intelligence (AD-based classification model specific to the battery 101 by collecting at least one battery-specific parameter as input. The RUL estimator 102 classifies data of the battery 101 as belonging to one of a plurality of pre-defined classes, based on the generated AI-based classification model. In an example, a class of data specific to a battery refers to a class of a battery.

Thus, the terms "class of battery", "class of battery data", and "class of data specific to battery" are used interchangeably herein.

The RUL estimator 102 verifies whether the RUL of the battery needs to be estimated, based on pre-configured settings using the battery-specific classification model and a reference classification model. The battery-specific classification model corresponds to an identified class of the battery data. In a case in which the pre-configured settings indicate that a second level RUL estimation is set for the identified class of the battery 101, the RUL estimator 102 performs the second level RUL estimation to estimate a fine (e.g., finer/more precise than a gross RUL described below) RUL of the battery 101. The RUL estimator 102 triggers at least one alert of a pre-configured type in response to the estimated fine RUL being greater than an upper threshold value or less than a lower threshold value of the RUL. In a case in which the second level RUL estimation is not set for the identified class of the battery 101, the RUL estimator 102 performs a first level RUL estimation, and estimates a gross RUL of the battery 101. The RUL estimator 102 compares the fine RUL with an End of Life (EOL) of the battery 101. In response to a difference between the fine RUL and the EOL of the battery 101 being less than or equal to a threshold value, the RUL estimator 102 displays the fine RUL to the user on an on-board display to inform the user that the battery 101 needs to be replaced. Additionally, in response to the difference between the fine RUL and the EOL of the battery 101 being less than or equal to the threshold value, the RUL estimator 102 triggers at least one alert of a preset type so as to notify the user that the battery 101 needs to be replaced.

Figure 2:
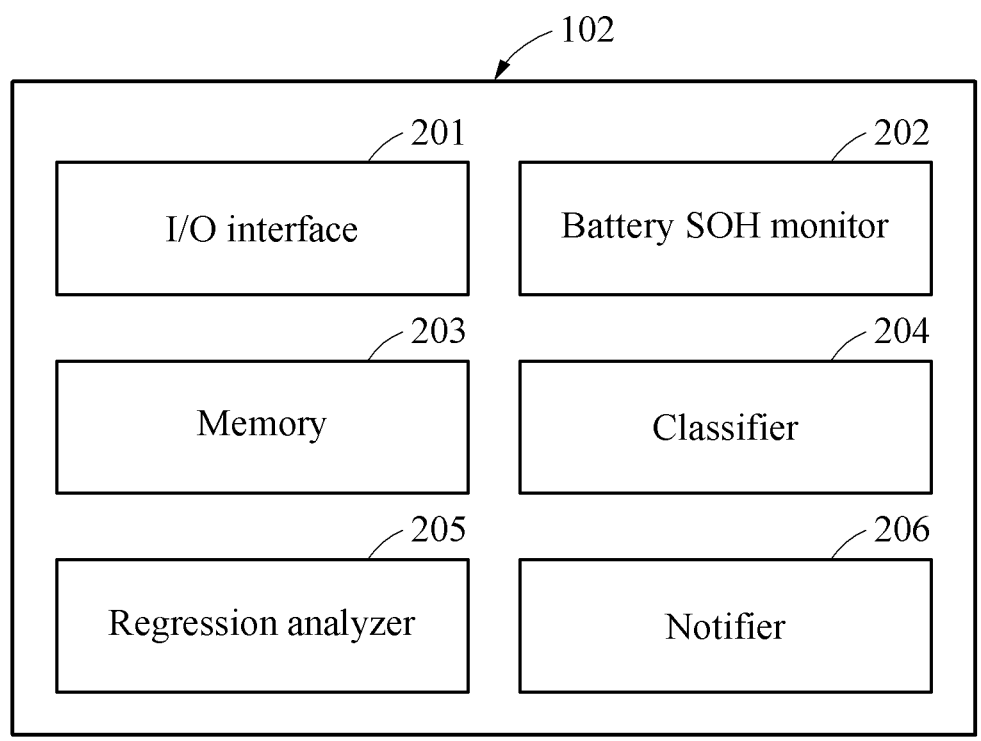
FIG. 2 is a block diagram illustrating an example of a remaining useful life (RUL) estimator.

FIG. 2 is a block diagram illustrating an example of an RUL estimator 102. The RUL estimator 102 includes an input/output (I/O) interface 201, a battery SOH monitor 202, a memory 203, a classifier 204, a regression analyzer 205, and a notifier 206.

The I/O interface 201 communicates with the battery 101 using at least one suitable communication channel, and collects at least one input required to perform real-time battery management. The I/O interface 201 communicates information pertaining to the estimated RUL to the user in the form of an alert/notification of a pre-configured format.

The battery SOH monitor 202 monitors the battery 101 and collects at least one battery-specific parameter as input using the I/O interface 201. The battery SOH monitor 202 decides whether a second level RUL estimation needs to be triggered, based on an identified class of the battery 101 and pre-configured settings. In a case in which the second level RUL estimation is not set for the identified class of the battery 101, the battery SOH monitor 202 triggers a first level RUL estimation to estimate a gross RUL. The battery SOH monitor 202 instructs the notifier 206 to trigger an alert to inform the user of an SOH of the battery 101 in terms of the estimated RUL. The terms "first level RUL estimation" and "gross RUL estimation" are used interchangeably herein. Similarly, the terms "second level RUL estimation" and "fine RUL estimation" are used interchangeably herein.

The memory 203 is configured to store at least one database. For example, the database includes a classification model that specifies at least one condition to identify a class of the battery 101, data that are classified under and that represent each of pre-defined classes, upper and lower threshold values of an RUL to be used to trigger an alert/notification to the user, and a regression model to be used to estimate the RUL of the battery 101. The memory 203 maintains a battery data repository which stores data such as values of selected battery parameters collected during a charge/discharge/impedance cycle of the battery 101. The battery data repository includes data such as previously collected inputs to be used as a reference to determine parameters such as an SOH and a state of charge (SOC).

The classifier 204 communicates with the I/O interface 201 and collects battery-specific data required for classifying the battery 101 as belonging to one of the plurality of pre-defined classes, based on the classification model stored in the memory 203. The classifier 204 communicates, to the battery SOH monitor 202, information pertaining to the class to which the battery 101 belongs, thereby deciding whether an RUL of the battery 101 is to be estimated.

The regression analyzer 205 communicates with the battery SOH monitor 202 and collects a trigger to initiate at least one of the first level RUL estimation and the second level RUL estimation, so as to estimate the RUL of the battery 101. The regression analyzer 205 collects an identified class of the battery 101 as input for estimation of the RUL. The regression analyzer 205 performs at least one of the first level RUL estimation and the second level RUL estimation by performing regression modeling, to estimate a gross RUL and a fine RUL, respectively. The regression analyzer 205 communicates information pertaining to the estimated RUL to the battery SOH monitor 202.

The notifier 206 receives an instruction from the battery SOH monitor 202 to trigger an alert and send a notification message of a suitable format to the user, through a suitable communication channel provided by the I/O interface 201.

Figure 3:
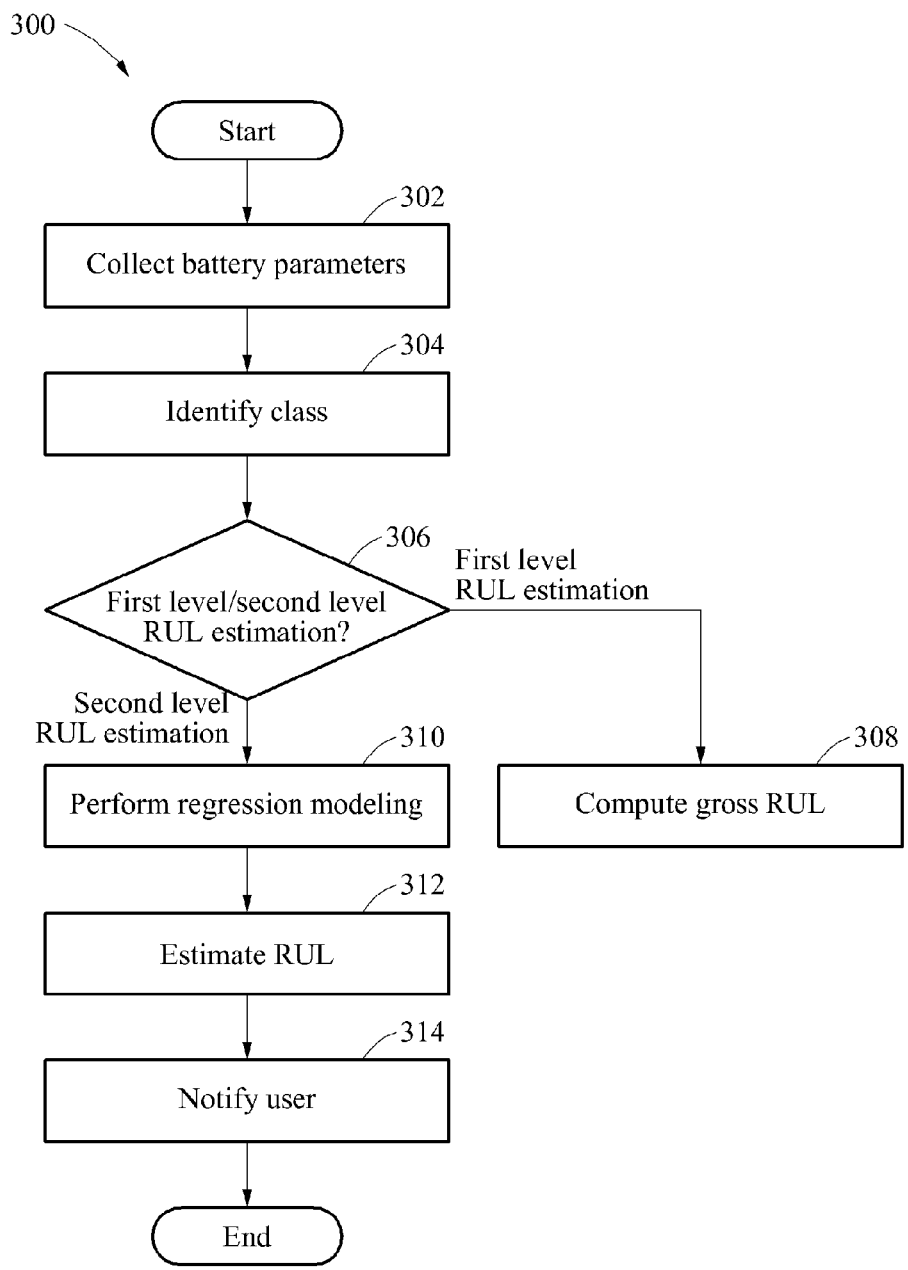
FIG. 3 is a flowchart illustrating an example of a process of measuring an RUL in real time using a real-time battery management system.

FIG. 3 is a flowchart illustrating an example of a process 300 of measuring an RUL in real time using the real-time battery management system 100. In operation 302, the RUL estimator 102 monitors the battery 101 and collects, from the battery 101, battery parameters such as voltage, current, and temperature, for example. In operation 304, the RUL estimator 102 identifies a class of the battery by processing the collected battery parameters based on a classification model. In an example, the class of the battery indicates a percentage of a charge/discharge/impedance cycle of the battery. A number of classes and a definition of each class in terms of a number of charge/discharge/impedance cycles (or "cycles," for short) completed are customized based on requirements of a user. For example, the classes are as follows.

Class A: 0% to 25% of total number of supported cycles
Class B: 25% to 50% of total number of supported cycles
Class C: 50% to 75% of total number of supported cycles
Class D: 75% to 100% of total number of supported cycles In this example, data is segregated into four different classes in terms of the number of charge/discharge/impedance cycles completed by the battery. In an example, based on the requirements, a boundary value of the number of completed charge/discharge/impedance cycles may be changed, and the data may be arranged accordingly.

In operation 306, the RUL estimator 102 selects at least one of a first level RUL estimation and a second level RUL estimation based on the identified class of the battery and pre-configured settings. In a case in which the second level RUL estimation is set for the identified class, the RUL estimator 102 performs regression modeling to estimate a fine RUL, in operation 310. The user selects the class for performing the second level RUL estimation based on an application.

In the example described above, batteries which have completed more than 75% of the total number of supported charge/discharge/impedance cycles belong to the class D. Considering that the batteries belonging to the class D are approaching completion of their life cycles (total number of supported cycles), the user sets the RUL estimator to perform regression modeling of data of the class D. By performing regression modeling, the RUL estimator 102 estimates a fine RUL of the battery 101, in operation 312. For example, in a case in which the battery 101 belongs to one of the classes A, B, and C which do not require execution of regression modeling, the RUL estimator 102 computes a gross RUL of the battery 101, in operation 308. The gross RUL indicates a rough estimate of the RUL.

The RUL estimator 102 provides an option for the user to configure at least one of an upper threshold value and a lower threshold value of the RUL and alerts. Following operation 312, in operation 314, the RUL estimator 102 triggers an alert in response to the estimated RUL being above the upper threshold value or below the lower threshold value. In some examples, a portion of operations of the process 300 of FIG. 3 may be omitted.

Figure 4:
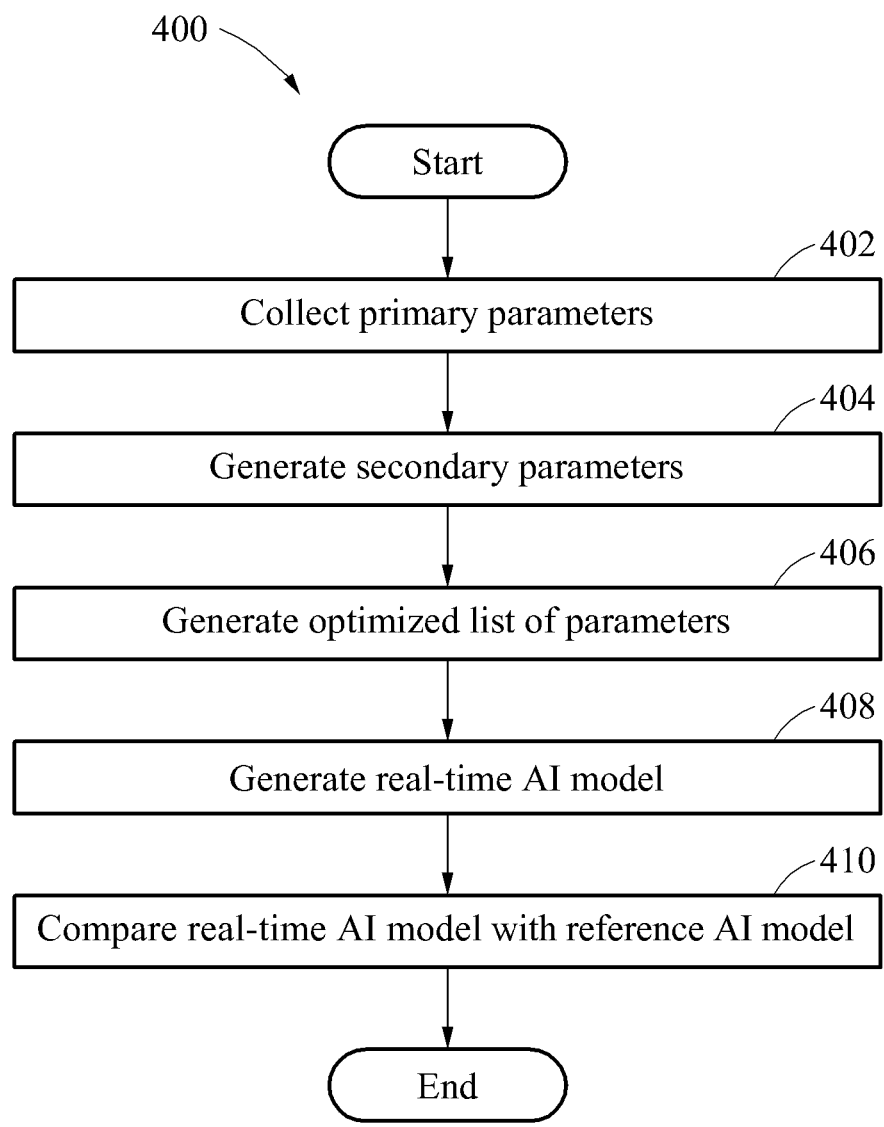
FIG. 4 is a flowchart illustrating an example of a process of classifying a battery to estimate an RUL.

FIG. 4 is a flowchart illustrating an example of a process 400 of classifying the battery 101 to estimate an RUL. In operation 402, the RUL estimator 102 collects, from each battery cycle, at least one parameter among primary parameters. Examples of the primary parameters are as follows.

minV: Minimum recorded voltage maxV: Maximum recorded voltage minT: Minimum recorded temperature maxT: Maximum recorded temperature TminV: Time point corresponding to minimum recorded voltage TmaxV: Time point corresponding to maximum recorded voltage TminT: Time point corresponding to minimum recorded temperature TmaxT: Time point corresponding to maximum recorded temperature Cap: Battery capacity at the end of the cycle By processing the primary parameters, the RUL estimator 102 generates at least one secondary parameter that is required for identifying the class of the battery, in operation 404. For example, at least one of the below mentioned secondary parameters is calculated by the RUL estimator 102, from voltage and temperature curves of each discharge cycle.

1) Signal Energy (E)

The signal energy is a measure of signal strength over time, and is given by Equation 1.

$$E = \int_{-\infty}^{\infty} |x(t)|^2 t \qquad \text{[Equation 1]}$$

2) Fluctuation Index (FI)

The fluctuation index is a measure of change in signal value with respect to its mean, and is given by Equation 2.

$$FI = \frac{\sqrt{\sum (y_i - \mu)^2}}{Freq} \qquad \text{[Equation 2]}$$

In Equation 2, μ denotes a mean of the signal, and Freq denotes a sampling frequency.

3) Curvature Index (CI)

The curvature index is a measure of direction in which a unit tangent vector rotates as a function of the parameter along the signal, and is given by Equation 3.

$$CI = \frac{\sum \theta}{\omega} \qquad \text{[Equation 3]}$$

In Equation 3, $$\theta = \frac{y''}{(1 + y'^2)^{\frac{3}{2}}},$$

y denotes a signal, and ω denotes a length of the signal.

4) Concave Convex Index (CCI)

The concave convex index is a measure of convexity of the signal. A convex signal has an index exceeding 0.5, whereas a concave signal has an index less than 0.5. The index is calculated using slope and intersection estimation.

5) Skewness Index (SI)

The skewness index is a measure of the extent to which a probability distribution of the signal leans towards the mean of the signal. The skewness index is given by Equation 4.

$$SI = \frac{\sum_{i=1}^{n} (y_i - \mu)}{\sigma^3} \qquad \text{[Equation 4]}$$

In Equation 4, μ denotes the mean of the signal, and a denotes a standard deviation of the signal.

5) Kurtosis Index (KI)

The kurtosis index is a measure of the "peakedness" of the probability distribution of the signal. The kurtosis index is given by Equation 5.

$$KI = \frac{\sum_{i=1}^{n} (y_i - \mu)^4}{\sigma^4} \qquad \text{[Equation 5]}$$

In Equation 5, μ denotes the mean of the signal, and a denotes the standard deviation of the signal.

In operation 406, the RUL estimator 102 optimizes the primary and secondary parameters to generate a set of optimized parameters. In an example, the RUL estimator 102 uses at least one suitable technique for optimizing the parameters. Examples of the techniques to be used by the RUL estimator are as follows.

Principal Component Analysis (PCA)

Manual optimization based on data spread and visualization individual parameters, permutation and combination of parameters Support Vector Machine (SVM) Attribute Evaluator In operation 408, the RUL estimator 102 generates a real-time AI model for the battery 101 based on the optimized data. In an example, the real-time AI model indicates an SOH of the battery at an instance of time, and includes data indicating a number of completed charge/discharge/impedance cycles corresponding to the battery 101.

In operation 410, the RUL estimator 102 compares the real-time AI model with a reference AI model. The reference AI model possesses information on data representing different classes. In an example, the reference AI model is generated offline. By comparing the data in the real-time AI model with the reference AI model, the RUL estimator 102 identifies the class that matches the data present in the real-time AI model. For example, in response to the data in the real-time AI model matching the data representing the "class D", the battery 101 is identified as belonging to the class D.

Various operations of the method 400 may be performed in the order presented, in a different order, or simultaneously. Further, in some examples, a portion of the operations listed in FIG. 4 may be omitted.

Figure 5:
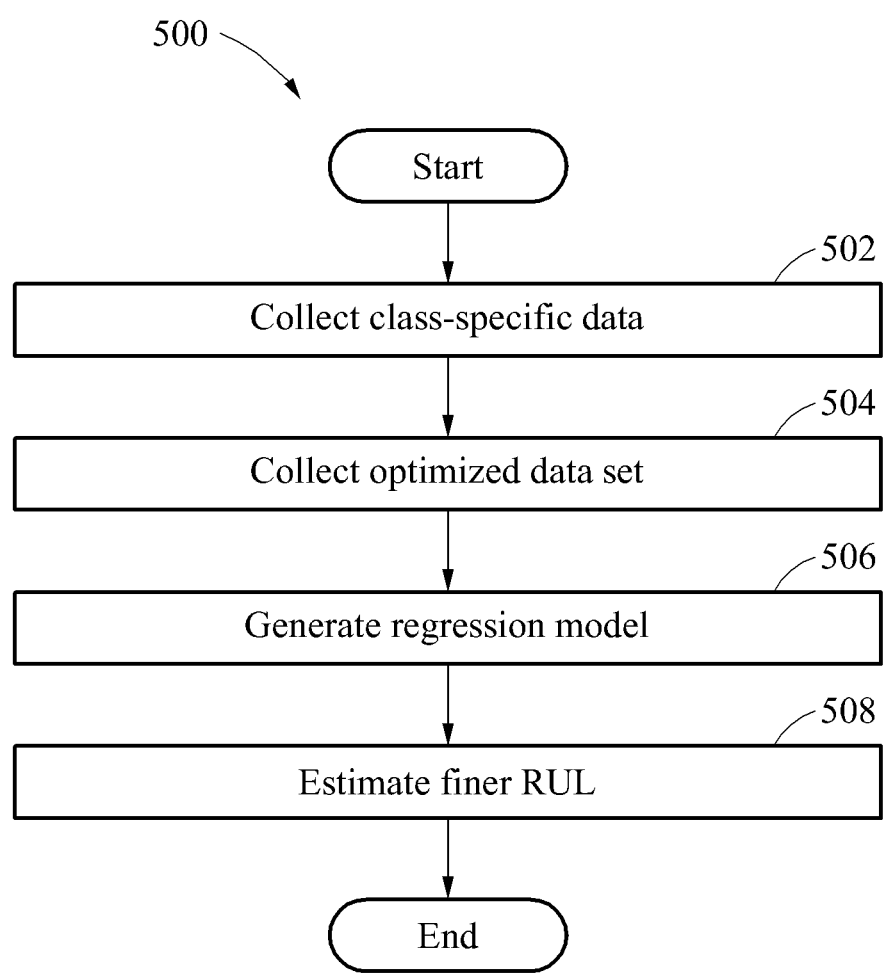
FIG. 5 is a flowchart illustrating an example of a process of estimating an RUL.

FIG. 5 is a flowchart illustrating an example of a process 500 of estimating an RUL. In a case in which the RUL estimator 102 is set to perform a regression modeling process for an identified class to estimate a fine RUL, the RUL estimator 102 collects class-specific data, in operation 502. The class-specific data represents a class to which the battery 101 belongs. Further, the RUL estimator 102 collects data that represents the class to which the battery 101 belongs.

In operation 504, the RUL estimator 102 collects an optimized data set that represents the class of the battery. In an example, the optimized data set is the same as an optimized data set used while identifying the class of the battery. The optimized data set includes a signature value that is unique to the battery being monitored, which helps in RUL estimation specific to the battery 101. In operation 506, the RUL estimator 102 generates a regression model using a suitable technique such as support vector regression (SVR), based on the optimized data that represents the class.

While generating the regression model, the RUL estimator 102 performs scaling of the battery cycle into percentage (%) of (100−RUL) value. During this process, each battery cycle that belongs to the identified class is mapped to percentage of (100−RUL) value. In an example, the process of mapping the battery cycle to generate the regression model is an offline process.

In operation 508, in order to estimate a fine RUL, the RUL estimator 102 collects data representing the cycle to which the battery 101 belongs. Further, the RUL estimator 102 generates a reference regression model based on the collected data. By comparing the regression model with the reference regression model, the RUL estimator 102 identifies the percentage of battery life that is complete. In particular, the RUL estimator 102 identifies data in the reference regression model matching data in the regression model, and estimates the percentage of battery life that is complete using the identified data in the reference regression model. In addition, the RUL estimator 102 subtracts the value of completed battery life from 100% to estimate the fine RUL. The value 100% represents a full/maximum battery cycle. The fine RUL is measured as expressed by Equation 6.

$$\text{Fine RUL (\%)} = 100 - X(\%) \quad \text{[Equation 6]}$$

In Equation 6, X denotes a value of completed battery life.

Various operations of the method 500 may be performed in the order presented, in a different order, or simultaneously. Further, in some examples, a portion of the operations listed in FIG. 5 may be omitted.

In an example, the battery management system 100 is used to measure an RUL in at least three different models, namely a single battery model, a temperature-specific model, and a generic model. Some use-case scenarios and validation of the proposed algorithm against experimental data, which show how the RUL estimation is performed in different modes, are given below. The experimental data is used from a battery data set repository of the NASA prognostics center of excellence (PCoE). The usage of the data is purely to demonstrate the accuracy of the proposed method. The algorithm may also be used in other cases, using other sources of battery data, for RUL estimation.

In all three modes, the following main input parameters of an SVM classifier are used for classification.
Kernel: Radial Basis Function
SVM Type: C-SVC
Degree of Freedom: 3
Epsilon: 0.001
Cost: 1.0
Gamma: 0.0
Loss: 0.1

Also, it is assumed that the battery cycle data is divided into four classes A, B, C, and D.

1) Single Battery Model
Generating Classification model
Number of batteries used for training and testing: 1
Number of data points used for training: 137
   Class A: 34
   Class B: 35
   Class C: 34
   Class D: 34
Parameters used for classification: VCE, Cap, VC_FI
Number of data points used for testing: 60 (15 data points for each class)
Result Summary:
   Correctly Classified Instances: 56 (93.33%)
   Incorrectly Classified Instances: 4 (6.66%)
   Kappa statistic: 0.9111
   Mean absolute error: 0.0333
   Root mean squared error (RMSE): 0.1826
Class wise Accuracy Level

TABLE 1

| Class | True Positive Rate | False Positive Rate | Precision | Recall | F-Measure | ROC Area |
|---|---|---|---|---|---|---|
| A | 0.867 | 0 | 1 | 0.867 | 0.929 | 0.933 |
| B | 1 | 0 | 1 | 1 | 1 | 1 |
| C | 0.933 | 0.067 | 0.824 | 0.933 | 0.875 | 0.933 |
| D | 0.933 | 0.022 | 0.933 | 0.933 | 0.933 | 0.956 |
| Wt. Avg | 0.933 | 0.022 | 0.939 | 0.933 | 0.934 | 0.956 |

Confusion Matrix

TABLE 2

| Classified As Classes | A | B | C | D |
|---|---|---|---|---|
| A | 13 | 0 | 2 | 0 |
| B | 0 | 15 | 0 | 0 |
| C | 0 | 0 | 14 | 1 |
| D | 0 | 0 | 1 | 14 |

The confusion matrix represents the accuracy with which data is identified as belonging to specific classes.
Regression modeling
Data from one battery taken for model building and validation
Number of battery cycles: 49
Number of cycles for Training set: 34
Number of cycles for Testing (30%): 15

RUL under estimation error: 0.1270% (Maximum), 0.1270% (Minimum), 0.1270% (Average)
RUL over estimation error: 0.9890% (Maximum), 0.1540% (Minimum), 0.4380% (Average)
RMSE: 0.4932%
Avg. Accuracy: 99.50%

2) Temperature-Specific Model (Room/High Temperature Model)
Generating Classification model
Number of batteries used for training and testing: 9
Number of data points used for training: 867
   Class A: 217
   Class B: 219
   Class C: 214
   Class D: 217
Parameters used for classification: VCE, minT, maxT, Cap, VC_FI
Number of data points used for testing: 369 (~92 data points for each class)
Result Summary:
   Correctly Classified Instances: 332 (89.97%)
   Incorrectly Classified Instances: 37 (10.03%)
   Kappa statistic: 0.8663
   Mean absolute error: 0.0795
   Root mean squared error: 0.2239
Class wise Accuracy Level

TABLE 3

| Class | True Positive Rate | False Positive Rate | Precision | Recall | F-Measure | ROC Area |
|---|---|---|---|---|---|---|
| A | 0.935 | 0.029 | 0.915 | 0.935 | 0.925 | 0.953 |
| B | 0.903 | 0.033 | 0.903 | 0.903 | 0.903 | 0.935 |
| C | 0.837 | 0.032 | 0.895 | 0.837 | 0.865 | 0.902 |
| D | 0.924 | 0.04 | 0.885 | 0.924 | 0.904 | 0.942 |
| Wt. Avg | 0.9 | 0.033 | 0.9 | 0.9 | 0.899 | 0.933 |

Confusion Matrix

TABLE 4

| Classified As Classes | A | B | C | D |
|---|---|---|---|---|
| A | 86 | 6 | 0 | 0 |
| B | 5 | 84 | 3 | 1 |
| C | 2 | 3 | 77 | 10 |
| D | 1 | 0 | 6 | 85 |

Regression modeling
for Room/High Temperature (24° C.-44° C.) Model
   Data from multiple batteries are selected
   Total number of battery cycles: 309
   Number of cycles for Training set: 216
   Number of cycles for Testing (30%): 93
   RUL under estimation error: 13.3620% (Maximum), 0% (Minimum), 5.761% (Average)
   RUL over estimation error: 11.598% (Maximum), 0.159% (Minimum), 4.813% (Average)
   RMSE: 6.2619%
   Avg. Accuracy: 93.73%
for Low Temperature (4° C.) Model
   Data from multiple batteries at low temperature are selected
   Total number of battery cycles: 231
   Number of cycles for Training set: 162
   Number of cycles for Testing (30%): 69
   RUL under estimation error: 15.527% (Maximum), 0.375% (Minimum), 4.446% (Average)
   RUL over estimation error: 14.452% (Maximum), 0.012% (Minimum), 6.242% (Average)
   RMSE: 6.9083%
   Avg. Accuracy: 93.1%

3) Generic Model
Classification model
Number of batteries used for training and testing: 18
Number of data points used for training: 1519
   Class A: 381
   Class B: 382
   Class C: 377
   Class D: 379
Parameters used for classification: VCE, minT, maxT, Cap, VC_FI
Number of data points used for testing: 648 (data points for each class)
Result Summary:
   Correctly Classified Instances: 526 (81.17%)
   Incorrectly Classified Instances: 122 (18.83%)
   Kappa statistic: 0.749
   Mean absolute error: 0.0925
   Root mean squared error: 0.3068
Class wise Accuracy Level

TABLE 5

| Class | True Positive Rate | False Positive Rate | Precision | Recall | F-Measure | ROC Area |
|---|---|---|---|---|---|---|
| A | 0.901 | 0.043 | 0.874 | 0.901 | 0.888 | 0.929 |
| B | 0.759 | 0.06 | 0.809 | 0.759 | 0.783 | 0.85 |
| C | 0.753 | 0.097 | 0.722 | 0.753 | 0.737 | 0.828 |
| D | 0.833 | 0.051 | 0.844 | 0.833 | 0.839 | 0.891 |
| Wt. Avg | 0.812 | 0.063 | 0.812 | 0.812 | 0.812 | 0.874 |

Confusion Matrix

TABLE 6

| Classified As Classes | A | B | C | D |
|---|---|---|---|---|
| A | 146 | 12 | 0 | 4 |
| B | 13 | 123 | 25 | 1 |
| C | 4 | 16 | 122 | 20 |
| D | 4 | 1 | 22 | 135 |

Regression Model
   Data from multiple batteries of a specific class are selected
   Total number of battery cycles: 541
   Number of cycles for Training set: 379
   Number of cycles for Testing (30%): 162
   RUL under estimation error: 16.905% (Maximum), 0% (Minimum), 6.649% (Average)
   RUL over estimation error: 14.173% (Maximum), 0.09% (Minimum), 5.657% (Average)
   RMSE: 7.296%
   Avg. Accuracy: 92.7%

Figure 6A:
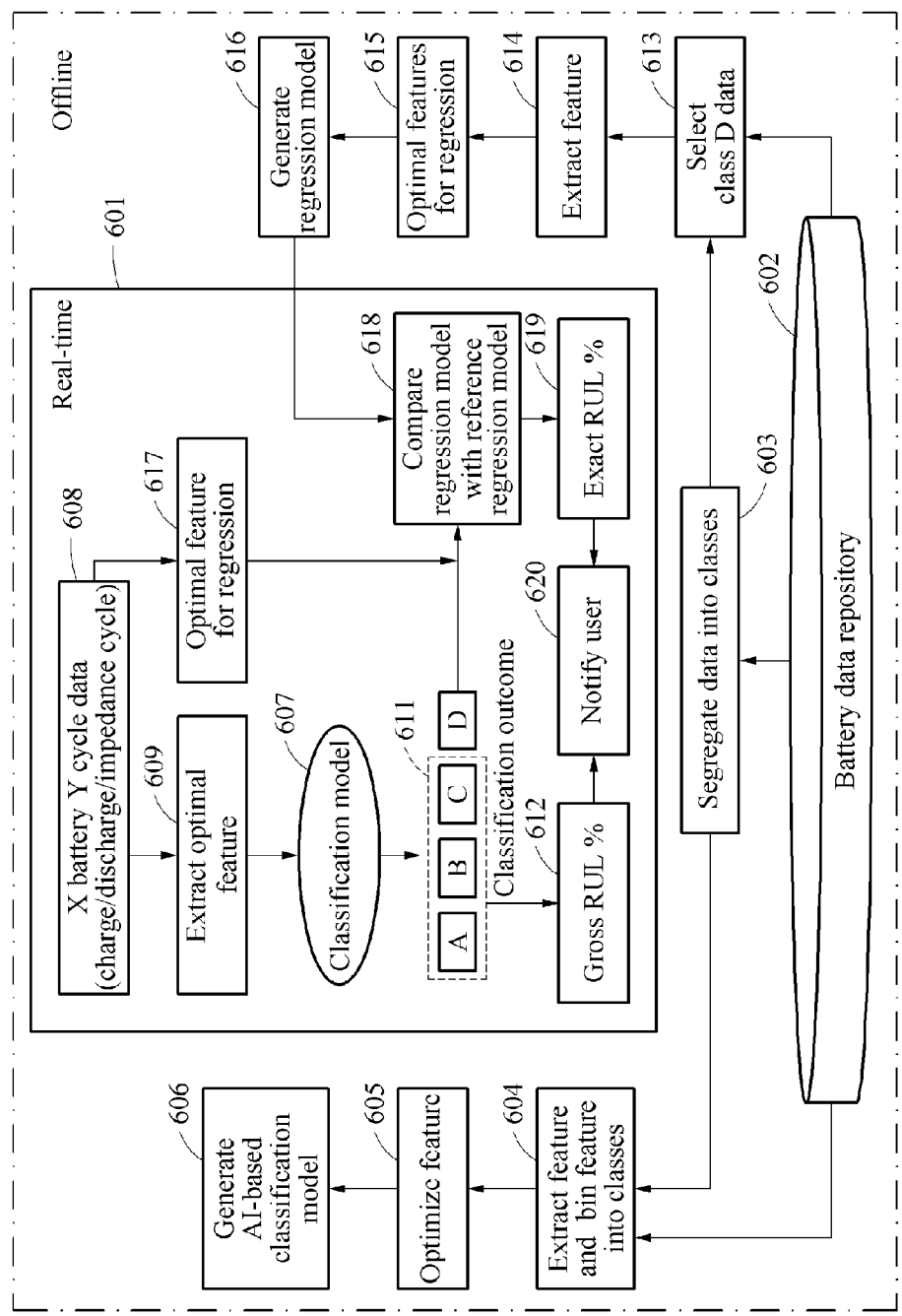
FIGS. 6A and 6B illustrate an example scenario of a process of estimating an RUL.
Figure 6B:
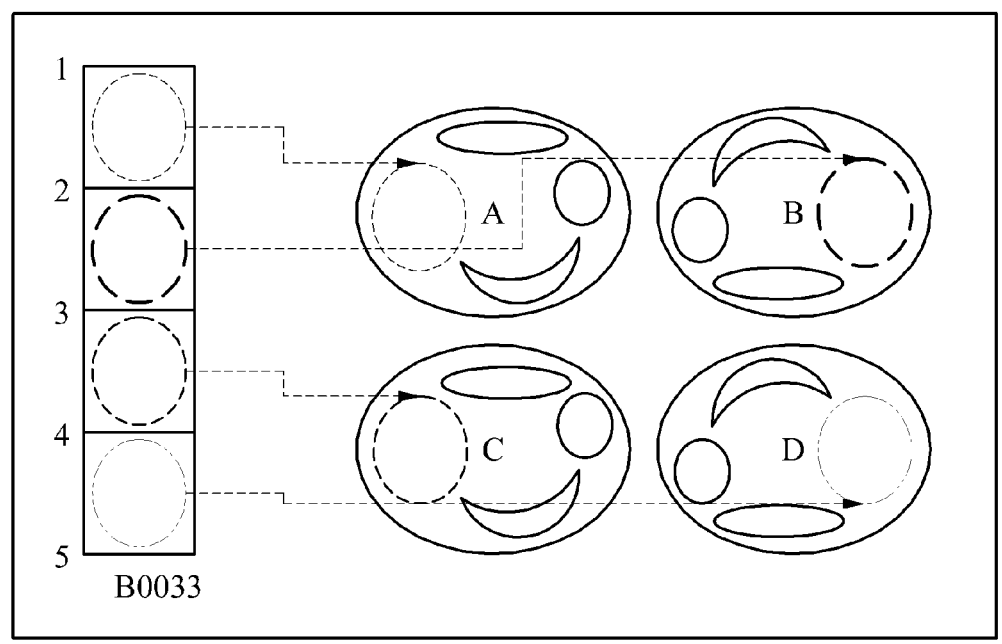

FIGS. 6A and 6B illustrate an example scenario of a process of estimating an RUL. In FIG. 6A, a process inside a block 601 is a real-time process, and a process outside the block 601 is an offline process. In this scenario, battery cycle data is classified into four classes A, B, C, and D as depicted in FIG. 6B.

Class A: Contains data of batteries ranging from fresh batteries to batteries that have completed 25% of a total number of supported charge/discharge/impedance cycles Class B: Contains data of batteries ranging from batteries that have completed 25% to batteries that have completed up to 50% of a total number of supported charge/discharge/impedance cycles Class C: Contains data of batteries ranging from batteries that have completed 50% to batteries that have completed up to 75% of a total number of supported charge/discharge/impedance cycles Class D: Contains data of batteries ranging from batteries that have completed 75% of a total number of supported charge/discharge/impedance cycles up to the end of their life The system 100 is configured to initiate a fine RUL estimation in a case in which collected data indicates that the battery 101 belongs to the class D. In a case in which the collected data indicates that the battery 101 belongs one of the classes A, B, and C, the system 100 computes only a gross RUL.

Through offline operations 603 to 606, an AI-based classification model is generated based on class-specific data collected from a battery data repository 602. Specifically, the RUL estimator 102 segregates data into classes in operation 603, extracts features from the segregated data and bins the extracted features into classes in operation 604, optimizes the extracted features in operation 605 and generates an AI-based classification model, based in the optimized features, in operation 606. At the same time that operations 603 to 606 are performed, in real-time operation 608, the RUL estimator 102 collects real-time inputs from the battery 101 being monitored. In operation 609, by processing the data collected in real time, the RUL estimator 102 extracts certain features which are required for feature optimization. By comparing an optimized set of features with a classification model 607, the RUL estimator 102 identifies a class of the battery 101. In a case in which the class of the battery is identified in operation 607 as one of the classes "A", "B" and "C" 610, the RUL estimator calculates a gross RUL in operation 612.

While offline operations 604 to 606 are performed, offline operations 613 to 616 are also performed. Specifically, in operation 613, the RUK estimator 102 selects class D data from the segregated data provided in operation 603. In operation 614, the RUL estimator 102 extracts features from the class D data. Then, the RUL estimator 102 optimizes the extracted features in operation 615 and generates a regression model based on the optimized features in operation 616.

Returning to the real-time operations, following operation 608, a set of features optimized for a reference regression model is provided in operation 617. In a case in which the class of the battery is identified as the class "D" 611 in operation 607, the RUL estimator 102 generates a reference regression model in operation 618 based on the set of optimized features from operation 617, and compares the regression model generated offline in operation 616 to the reference regression model. By comparing the regression model generated offline in operation 616 to the reference regression model, the RUL estimator 102 measures an exact/fine percentage of the RUL in operation 619. By using a suitable communication method, a user is notified about the measured gross RUL or the exact/fine RUL, in operation 620.

Figure 7A:
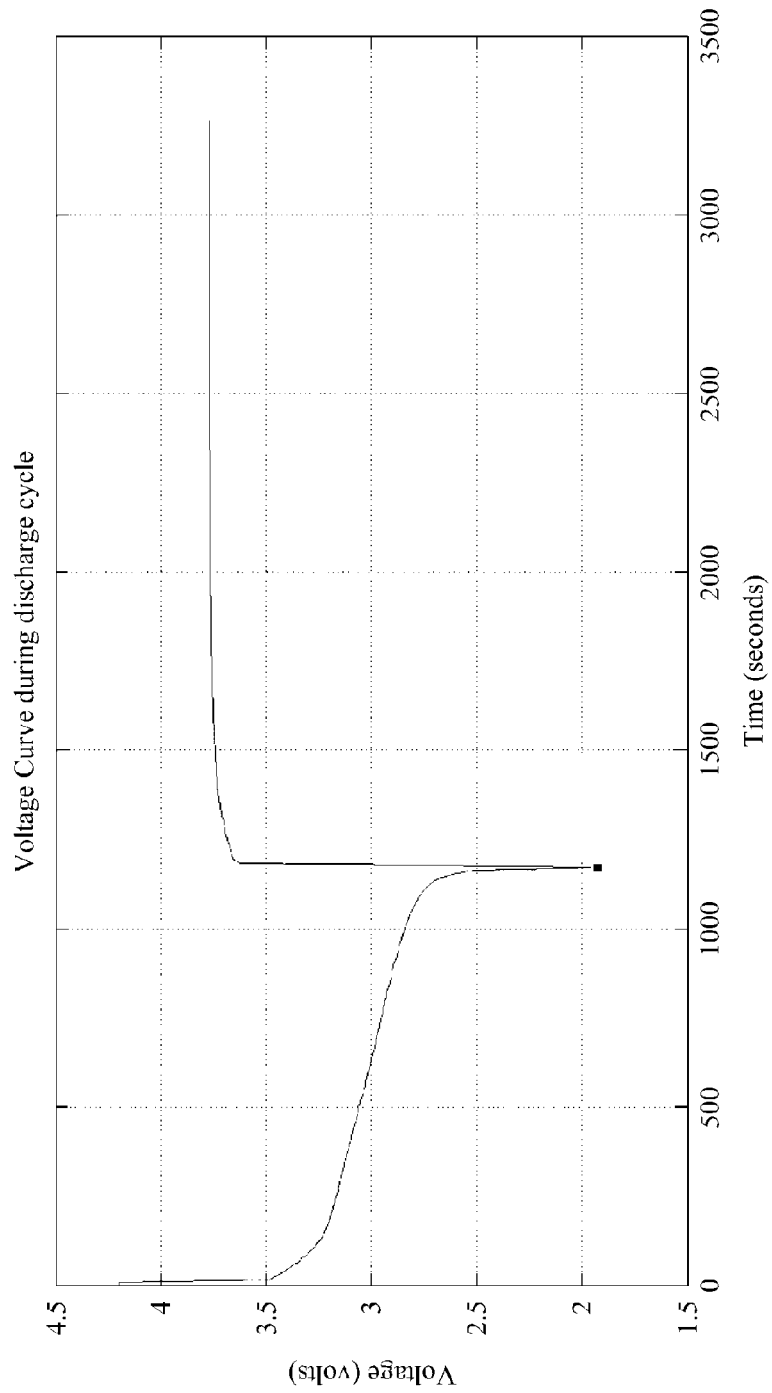
FIGS. 7A, 7B, 7C, 7D and 7E illustrate examples of experimental data associated with a process of estimating an RUL.
Figure 7B:
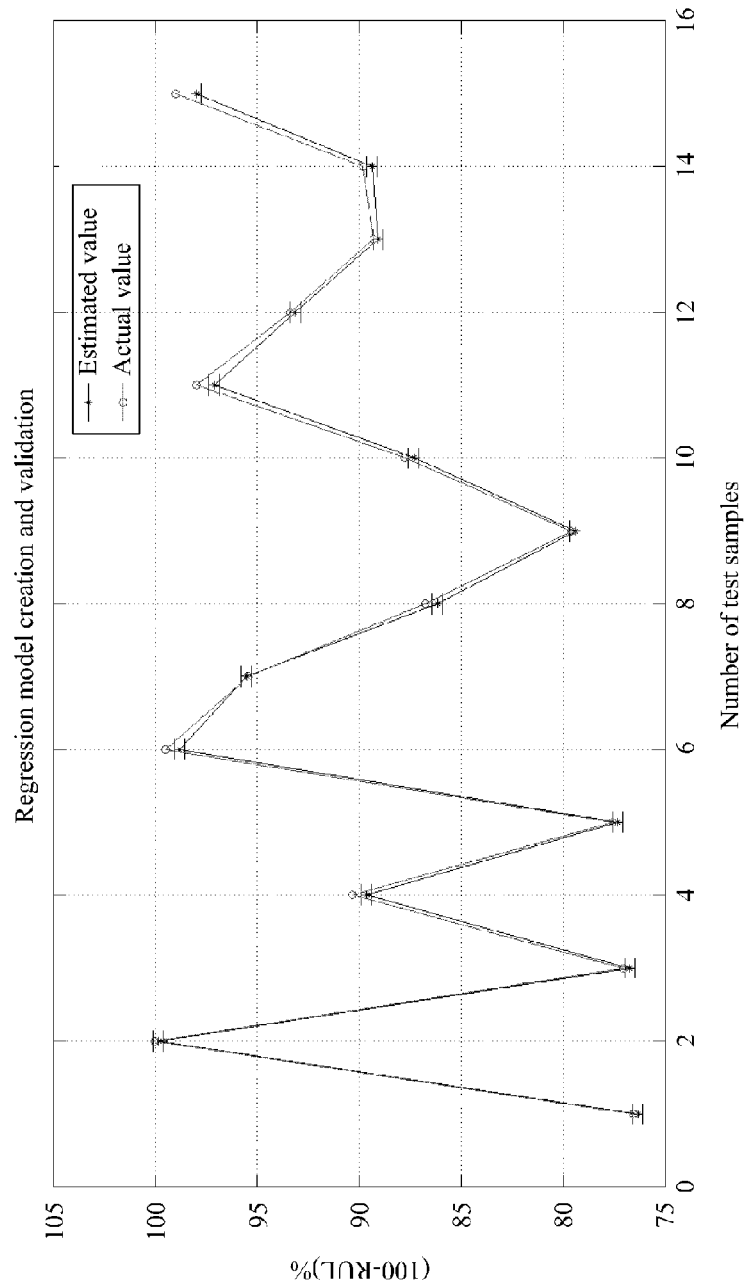

FIGS. 7A, 7B, 7C, 7D, and 7E illustrate examples of experimental data associated with a process of estimating an RUL. FIG. 7A depicts a voltage curve of a battery in a discharge cycle. FIG. 7B illustrates RUL estimation in a case in which regression modeling and estimation is performed from a single battery.

Figure 7C:
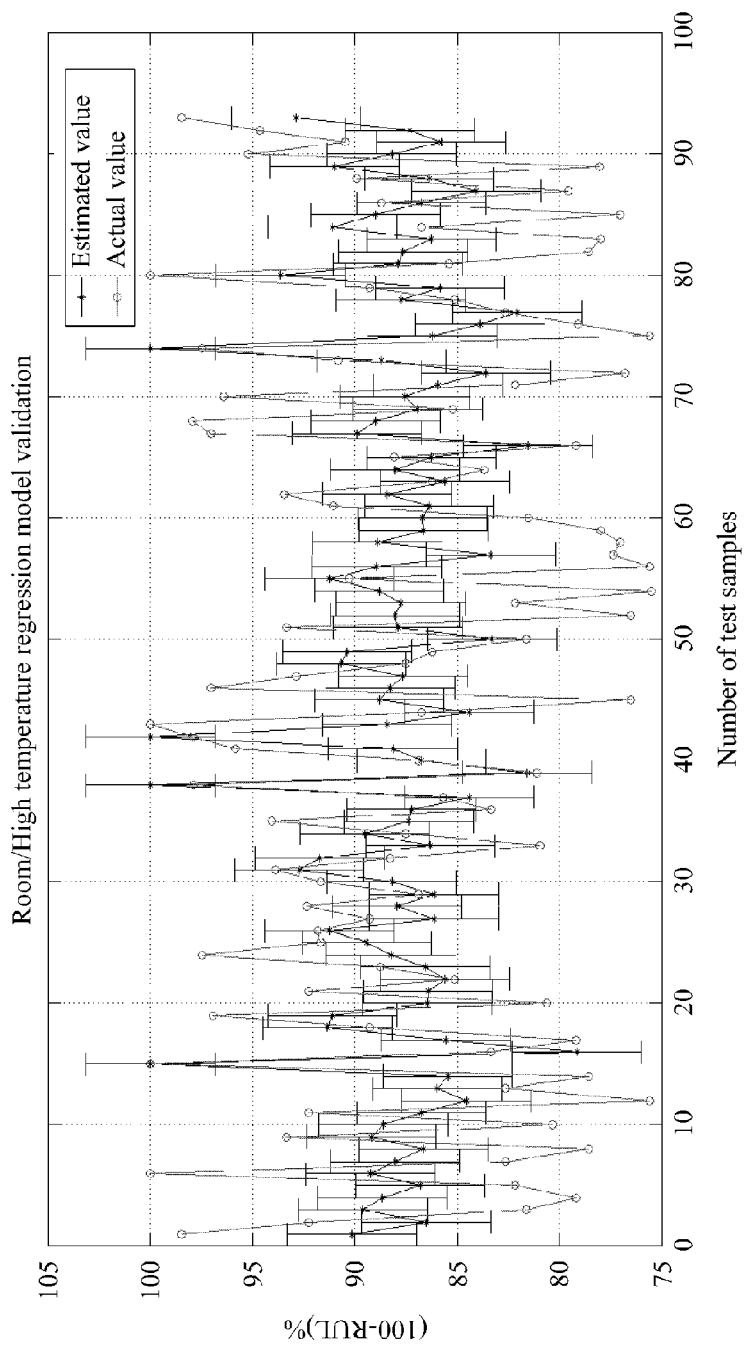

FIG. 7C illustrates a graph representing an RUL estimation result computed using a regression model of room/high temperature. Here, two regression models are generated based on operating temperature of batteries, one model for high/room temperature operated batteries and the other model for low temperature operated batteries. The estimated value curve is drawn with an error bar to show its overlap with an actual value. In this example, sample data for testing is randomly selected from a set of batteries listed in Table 7. Note that each value used for testing is independent of other values.

TABLE 7

| Cell No | Current | End Voltage | EOL Condition | Op Temp | No of Cycles |
|---|---|---|---|---|---|
| 1 | 2 A | 2.7 V | 30% fade in | 24 C. | 168 |
| 2 | Constant | 2.5 V | rated capacity | | 168 |
| 3 | Current | 2.2 V | (2 Ahr to | | 168 |
| 4 | | 2.5 V | 1.4 Ahr) | | 132 |
| 5 | 4 A | 2.0 V | Capacity | 24 C. | 197 |
| 6 | | 2.2 V | reduced to | | 197 |
| 7 | 2 A | 2.7 V | 20% fade (1.6 Ahr) | | 197 |
| 8 | Multiple - 1 A, | 2.2 V | Capacity | 24 & 44 C. | 47 |
| 9 | 2 A and 4 A | 2.5 V | reduced to | | 47 |
| 10 | | 2.7 V | 20% fade (1.6 Ahr) | | 47 |
| 11 | Multiple - 1 A, | 2 V | Capacity | 4 C. | 67 |
| 12 | 4 A | 2.2 V | reduced to | | 112 |
| 13 | | 2.5 V | 30% fade | | 112 |
| 14 | | 2.7 V | (1.4 Ahr) | | 112 |
| 15 | Fixed | 2 V | Capacity | 4 C. | 72 |
| 16 | load - 1 A | 2.2 V | reduced to | | 72 |
| 17 | | 2.5 V | 30% fade | | 72 |
| 18 | | 2.7 V | (1.4 Ahr) | | 72 |
| 19 | Fixed | 2 V | Capacity | 4 C. | 56 |
| 20 | load - 2 A | 2.2 V | reduced to | | 103 |
| 21 | | 2.5 V | 30% fade | | 102 |
| 22 | | 2.7 V | (1.4 Ahr) | | 102 |

Figure 7D:
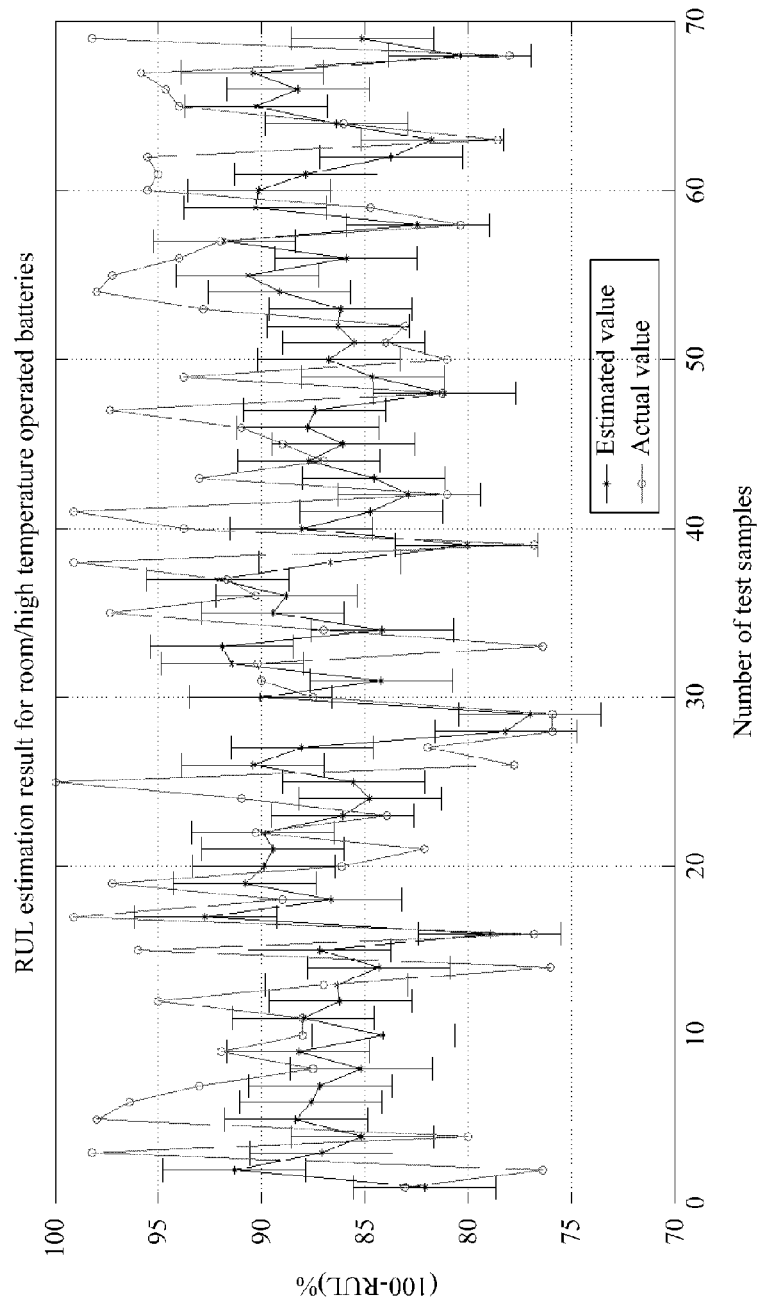

A graph of FIG. 7D represents an RUL estimation result computed using a regression model of low temperature, and the used regression model is a second regression model. It is noted that the model is tested on 70 data samples, and the accuracy is 93.10%. The estimated value curve is drawn with an error bar to show its overlap with an actual value. Here, the sample data for testing is randomly selected from the set of the batteries listed in Table 7.

Figure 7E:
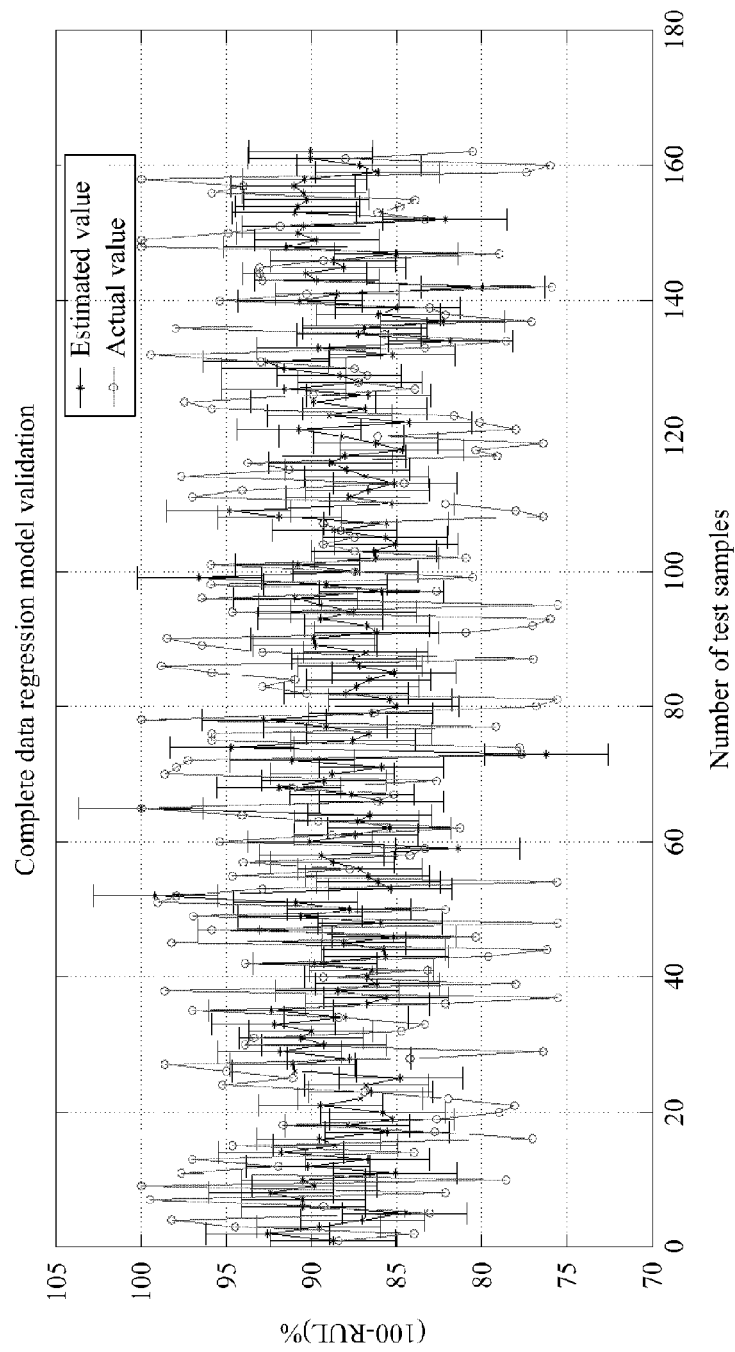

A graph depicted in FIG. 7E represents an RUL estimation result computed using a regression model for a complete data set considered for experimentation. In this example, data includes room/high temperature and low temperature datasets. The regression model used is a generic model that is applicable to any of batteries having similar operating profile as of the batteries listed in Table 1. It is also noted that the model is tested on 162 data samples. The estimated values correspond to the accuracy of 92.70%.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

The apparatuses, units, modules, devices, and other components (e.g., the RUL estimator 102, I/O interface 201, batter SOH monitor 202, memory 203, classifier 204, regression analyzer 205, and notifier 206) illustrated in FIGS. 1 and 2 that perform the operations described herein with respect to FIGS. 3-6B are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 3-6B. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 3-6B that perform the operations described herein with respect to FIGS. 1 and 2 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of estimating a remaining useful life (RUL) of a battery, the method comprising:
   identifying a class of data of the battery;
   determining whether the identified class of data is a first identified class;
   performing a fine RUL estimation of the battery in response to a determination that the identified class of data is the first identified class; and
   estimating a fine RUL of the battery in response to the determination of the first identified class.

2. The method of claim 1, wherein the class is pre-defined based on a number of at least one of charge, discharge, and impedance cycles of the battery.

3. The method of claim 1, wherein the identifying of the class comprises:

collecting at least one primary parameter;
generating at least one secondary parameter from the at least one primary parameter;
generating an optimized set of parameters based on the primary and secondary parameters;
generating a real-time artificial intelligence (AI) model specific to the data of the battery based on the optimized set of parameters;
comparing the real-time AI model with a reference AI model; and
identifying the class in the reference AI model having data matching data in the real-time AI model.

4. The method of claim 1, further comprising performing a gross RUL estimation to estimate a gross RUL of the battery in response to a determination that the identified class of data is a second identified class.

5. The method of claim 1, wherein the estimating of the fine RUL comprises:
collecting battery-specific data identified as belonging to the class;
generating a regression model based on the collected battery-specific data;
comparing the regression model with a reference regression model representing an optimized data set that represents the class;
identifying data in the reference regression model matching data in the regression model; and
estimating an RUL representing the identified data in the reference regression model as the fine RUL.

6. The method of claim 1, further comprising:
displaying the estimated fine RUL in response to a difference between the fine RUL and an end of life (EOL) of the battery being less than or equal to a threshold value.

7. A system for estimating a remaining useful life (RUL) of a battery, the system comprising:
an RUL estimator; and
a non-volatile memory comprising instructions, wherein the instructions are configured to cause the RUL estimator to:
identify a class of data of the battery;
determine whether the identified class of data is a first identified class;
perform a fine RUL estimation of the battery in response to a determination that the identified class of data is the first identified class; and
estimate a fine RUL of the battery in response to the determination of the first identified class.

8. The system of claim 7, wherein the RUL estimator is configured to provide at least one option to pre-define the class based on a number of at least one of charge, discharge, and impedance cycles of the battery.

9. The system of claim 7, further comprising a classifier configured to:
collect at least one primary parameter using an input/output (I/O) interface;
generate at least one secondary parameter from the at least one primary parameter;
generate an optimized set of parameters based on the primary and secondary parameters;
generate a real-time artificial intelligence (AI) model specific to the data of the battery based on the optimized set of parameters;
compare the real-time AI model with a reference AI model; and
identify the class in the reference AI model having data matching data in the real-time AI model,
wherein the RUL estimator is configured to identify the class of the data of the battery using the classifier.

10. The system of claim 7, further comprising:
a regression analyzer configured to measure a rough estimate of the RUL,
wherein the RUL estimator is configured to estimate a gross RUL using the regression analyzer.

11. The system of claim 7, wherein, to estimate the fine RUL of the battery, the RUL estimator is configured to:
collect battery-specific data identified as belonging to the class;
generate a regression model based on the collected battery-specific data;
compare the regression model with a reference regression model representing an optimized data set that represents the class;
identify data in the reference regression model matching data in the regression model; and
estimate the fine RUL based on the second level RUL estimation by estimating an RUL representing the identified data in the reference regression model as the fine RUL.

12. The system of claim 7, further comprising:
a display configured to display the fine RUL in response to a difference between the fine RUL and an end of life (EOL) of the battery being less than or equal to a threshold value.

13. A remaining useful life (RUL) estimator, comprising:
a processor;
a classifier implemented by the processor and configured to identify a class of data of a battery;
a state of health (SOH) monitor implemented by the processor and configured to determine whether the identified class of data is a first identified class;
a regression analyzer implemented by the process and configured to
perform a fine RUL estimation of the battery in response to a determination that the identified class of data is the first identified class; and
estimate a fine RUL of the battery in response to the determination of the first identified class.

14. The RUL estimator of claim 13, further comprising performing a gross RUL estimation to estimate a gross RUL of the battery in response to a determination that the identified class of data is a second identified class.

15. The RUL estimator of claim 13, wherein the class is pre-defined based on a number of at least one of charge, discharge, and impedance cycles of the battery.

16. The RUL estimator of claim 13, wherein the RUL estimator is configured to trigger an alert in response to the estimated fine RUL being greater than an upper threshold value or less than a lower threshold value.

17. The method of claim 4, wherein the estimating of the gross RUL comprises measuring a rough estimate of the RUL of the battery.

* * * * *